US006967885B2

(12) United States Patent
Barth, Jr. et al.

(10) Patent No.: US 6,967,885 B2
(45) Date of Patent: Nov. 22, 2005

(54) CONCURRENT REFRESH MODE WITH DISTRIBUTED ROW ADDRESS COUNTERS IN AN EMBEDDED DRAM

(75) Inventors: John E. Barth, Jr., Williston, VT (US); Toshiaki Kirihata, Poughkeepsie, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/757,846

(22) Filed: Jan. 15, 2004

(65) Prior Publication Data

US 2005/0157577 A1 Jul. 21, 2005

(51) Int. Cl.[7] ................................................. G11C 7/00
(52) U.S. Cl. ............. 365/222; 365/189.04; 365/230.03
(58) Field of Search .......................... 365/189.04, 222, 365/230.03, 230.05, 236

(56) References Cited

U.S. PATENT DOCUMENTS

| 5,555,527 | A | * | 9/1996 | Kotani et al. ............... 365/222 |
| 6,563,757 | B2 | * | 5/2003 | Agata ........................ 365/222 |
| 6,819,617 | B2 | * | 11/2004 | Hwang et al. .............. 365/222 |

* cited by examiner

Primary Examiner—Son Mai
(74) Attorney, Agent, or Firm—H. Daniel Schnurmann

(57) ABSTRACT

A concurrent refresh mode is realized by allowing a memory array to be refreshed by way of a refresh bank select signal, while concurrently enabling a memory access operation in another array. The refresh address management is greatly simplified by the insertion of row address counter integrated within each array. In the preferred embodiment, any combination of a plurality of the memory arrays is refreshed simultaneously while enabling a memory access operation. This concurrent mode also supports a multi-bank operation.

16 Claims, 7 Drawing Sheets

CONCURRENT REFRESH MODE WITH DISTRIBUTED ROW ADDRESS COUNTERS IN AN EMBEDDED DRAM

BACKGROUND OF THE INVENTION

This invention is generally related to an embedded dynamic random access memory (embedded DRAM), and more particularly, to a concurrent refresh mode and design which employs distributed row address counters integrated in each DRAM.

Improvements in semiconductor technology have enabled the design of processors having performance exceeding 1 Giga Hz. However, the system performance is often constrained by the performance of its memory. The presence of this drawback has created a potentially strong demand for high performance embedded DRAMs to help the processor achieve the necessary speed. For 90 nm technology generations and beyond, it is difficult to reduce the cell size and still improve the array access transistor performance of the embedded DRAM. This is true because the transistor threshold voltage cannot be reduced when device leakage is present. Yet, the operation voltage must be reduced to guarantee the device reliability and logic process compatibility. These considerations have created a fundamental shift from a data retention driven design to a memory availability driven design by utilizing a high performance logic device as a memory cell.

Referring to FIG. 1, there are shown simulated sensing signals illustrating the aforementioned assertions. In the plot referenced (A), a conventional array device 52A (not shown) having a 2.5 V wordline boosted voltage (VPP) and supported by a long bitline coupling 256 cells (256 b/BL) is compared to the plot referenced (B), wherein a logic array device 22A (not shown) powered by a 1.5V VPP is supported by a short bitline coupled to 64 cells. The sensing signal is extracted by changing the signal development time (tSIG), i.e., the time to develop a signal on the bitline when a wordline is activated over a random access cycle time (tRC) in a grounded sensing scheme. As the signal development time increases, an excess of charge in the cell is transferred to the bitline, increasing the sensing signal. However, when tSIG is incremented by more than about 40% of tRC, the voltage is not adequately written back to the cell, resulting in a smaller signal. Since the logic array device 22A is enabled by approximately 30% more current than that applicable to the corresponding array device 52A, approximately 80 mV of the sensing voltage can be achieved even for a 3.2 ns random access cycle time. However, employing a logic array device 22A requires a reduction in the data retention time to a value as small as 64 µs. The shorter retention time greatly reduces the memory availability, particularly for a large density memory because all the memory cells need to be refreshed within a given retention time to maintain the data bits. By way of example, a 4 Mb memory having 8K wordlines requires 8K refresh cycles within 64 µs. This, in turn, requires at least one refresh command every 8 ns, resulting in the memory being unavailable for an 8 ns random cycle memory. In order to overcome the memory availability problem in short retention DRAMs, a concurrent refresh mode is typically used, as described, e.g., in U.S. Pat. No. 4,185,323 issued to Johnson et al.

FIG. 2 is a block representation of a semiconductor memory chip 200 consisting of a plurality of DRAM memory banks 210. Each memory bank 210 consists of a plurality of DRAM memory cells (not shown) arranged in a two-dimensional matrix configuration, well known in the art, and which, accordingly, will not be discussed further. Once a memory access operation (read, write, or refresh operation) is initiated in a DRAM bank 210 (e.g., 210i), the DRAM bank (e.g., 210i) becomes unavailable for a random access cycle time tRC. During the memory access operation of the DRAM bank (e.g., 210i), other DRAM banks (e.g., 210j) can be simultaneously refreshed. Thus, the memory availability greatly improves by concurrently performing a refresh operation while enabling a memory access operation. There are two known methods for enabling a concurrent refresh mode in a semiconductor memory, the details of which will be discussed hereinafter, as explained hereinafter with reference to FIGS. 3 and 4.

FIG. 3 illustrates a first method to enable a concurrent refresh mode in a conventional static random access memory (SRAM) buffer. Details of this approach are described, e.g., in U.S. Pat. No. 5,999,474, issued to Leung et al. Semiconductor memory chip 300 consists of a plurality of DRAM banks (310DRAM), each consisting of a plurality of memory cells arranged in a two dimensional array configuration. Accessing bank 310DRAM-310j while concurrently refreshing at least one other bank 310DRAM-310 k is possible as long as the accessed bank and the refreshed bank differ from one another. This allows a plurality of cells (330k) supported by the corresponding wordline 320k in DRAM bank (310k) to be refreshed while accessing a plurality of cells (330j) supported by the corresponding wordline (320j) in the DRAM bank (310j). However, if array 310j is continuously addressed, some memory cells within the same array 310j will not be refreshed altogether since array 310j is continuously busy due to an uninterrupted memory access operation. This precludes performing a refresh operation of some memory cells in the same array (310j).

In order to overcome this problem, memory chip 300 is enhanced by adding an SRAM bank (310SRAM), featuring a dual port function that allows receiving and transferring data within a clock cycle. The access operation of the DRAM banks (310DRAM) and SLAM (310SRAM) are controlled by the TAG memory (310TAG), while the memory access of the memory chip 300 is enabled by a read or write command (not shown), a bank address (XBADD), and a word address (XWADD), wherein XBADD and XWADD identify one of the DRAM banks (310DRAM) and the appropriate wordline within the selected DRAM banks. When the memory access is enabled, wordline (320TAG) in the TAG memory (310TAG) and the wordlines (320s) in SRAM bank (310SRAM) are activated by decoding the word address (XWADD). This enables reading out data in the memory cells (330TAG) in within the TAG memory (310TAG) and data in the memory cells (330s) within the SRAM buffer (310SRAM). The read data bits (330TAG) of the TAG memory (310TAG) defines the bank address (TBADD) which, in turn, identifies the corresponding DRAM bank for the data bits (330s) currently read from the SRAM buffer (310SRAM). When TBADD coincides with the bank address input (XBADD), the data bits (330s) are the ones that are requested by the memory access command, since the data bits (330s) were previously copied from the corresponding DRAM bank to the SRAM buffer (310SRAM). Therefore, no DRAM bank access is necessary, and the read data bits from the SRAM buffer (310SRAM) are read am from the XDATA pins. On the other hand, if TBADD differs from the bank address inputs (XBADD), the TAG memory (310TAG) control the DRAM banks (310DRAM) as follows.

Assuming that TBADD identifies DRAM bank (310*i*), then, the data bits (330*s*) in the SRAM buffer (310SRAM) are stored back in DRAM bank (310*i*), where the wordline 320*i* is same as the wordline address of 320*s* (Direct Mapping). This allows data bits to be transferred from the SRAM memory cells (330*s*) to the DRAM memory cells (330*i*). Concurrent with the bank address input (XBADD), the corresponding DRAM bank (310*j*) is activated for a read operation. Then, the cell's data bits (330*j*) in the corresponding DRAM bank (310*j*) are read out, where wordline 320*j* coincides with the wordline address of 320*s* (Direct Mapping). They are read am from the XDATA pins. The cell's data bits (330*j*) are also stored in the cells (330*s*) of the SRAM buffer (310SRAM) TBADD is therefore updated to identify the DRAM bank 310*j* for a future memory access command. For a subsequent same addressing pattern (i.e., 330*j*), data bits are read out or written into the SRAM buffer (310SRAM), enabling a refresh operation of the memory cells even when only one array (i.e., 330*j*) is continuously addressed. This is possible since, eventually, the data bits in the array will be copied to the SRAM array, refreshing the array without infringing on any violations.

This concurrent refresh approach, however, has several drawbacks. First, it requires an SRAM array (310SARM), which is significantly larger. Secondly, on account of the TAG management, the logic becomes more complex which, in turn, slows down the latency of the memory access. Finally, this methodology is not appropriate for multi-bank memories since the memory bank becomes unavailable during a refresh operation within a given DRAM bank cycle (tRC). Multi-bank memory chips require addressing any bank that need to be addressed during each bank-to-bank access cycle (tRRD)—which is shorter than tRC—making it impossible to enable a refresh operation when a tRC cycle is required.

FIG. 4 illustrates the second method that enables a simultaneous refresh by utilizing a concurrent function for the DRAM. Semiconductor memory chip 400 consists of a plurality of DRAM banks 410 (410*i* through 410*j*), each of which is controlled by the corresponding address and command ports (420*i* through 420*j*). Therefore, any two or more banks can be activated concurrently. By way of the concurrent function, memory bank 410*i* remains in the read mode while still enabling a refresh operation for memory bank 410*j*. However, this approach requires a complex refresh system management to avoid a bank access contention caused by the concurrent function. While avoiding a bank access contention by the concurrent function, handling the refresh addresses in each array at the system level is highly complex since the address TAG for the refreshed memories for all the banks needs to be independently managed. As a result, employing the concurrent function for a simultaneous refresh requires significant system modifications.

OBJECTS AND SUMMARY OF THE INVENTION

Accordingly, it is an object of the invention to provide a concurrent refresh operation to an embedded DRAM to improve the memory availability.

It is another object of the invention to provide a concurrent refresh operation to an embedded DRAM without resorting to using an SRAM buffer.

It is still another object of the invention to provide a concurrent refresh operation to an embedded DRAM in order to simplify the design of a memory system.

It is further object of the invention to enable a concurrent refresh operation to an DRAM embedded in a multi-bank memory system.

It is still a further object of the invention to enable a concurrent refresh operation to an embedded DRAM resorting to only a refresh bank selection.

This invention describes a concurrent refresh mode, wherein the embedded DRAM enables a simultaneous memory access and refreshes the operations by way of a simple system modification. The concurrent refresh mode is realized by allowing the unselected memory array to be refreshed only by a refresh bank select port. Unlike conventional approaches, macro row address counters integrated in each bank track the wordline address within the corresponding banks. This greatly reduces the complexity of managing the refresh address in a concurrent refresh mode, since the in-macro refresh counter in each bank maintains independently the wordline refreshed. The system improvement that employs this concurrent refresh method is achieved solely by managing the bank access contention. The present invention is particularly advantageous for a multi-bank system having a short retention DRAM, since the refresh management can be integrated within the existing multi-bank management system. As long as the bank contention is managed, 100% of memory availability can be realized.

In another aspect of the present invention, there is provided a semiconductor memory consisting of two or more memory arrays, wherein each of the two arrays is coupled to a row address counter to generate a first word address within each array when a refresh command is given, while enabling at least one more array to be in a memory access mode.

In yet another aspect of the invention, there is provided a semiconductor memory that includes: i) a plurality of memory arrays, each of which comprises a plurality of memory cells arranged in a matrix and controlled by a row address counter uniquely assigned to each of the memory arrays, the row address counter generating a first word address; and ii) means for enabling a refresh operation in the memory cells, the memory cells being identified by the first word address when a refresh command is issued to a corresponding memory array.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below, serve to explain the principles of the invention.

DETAILED DESCRIPTION OF THE INVENTION

Figure 1:
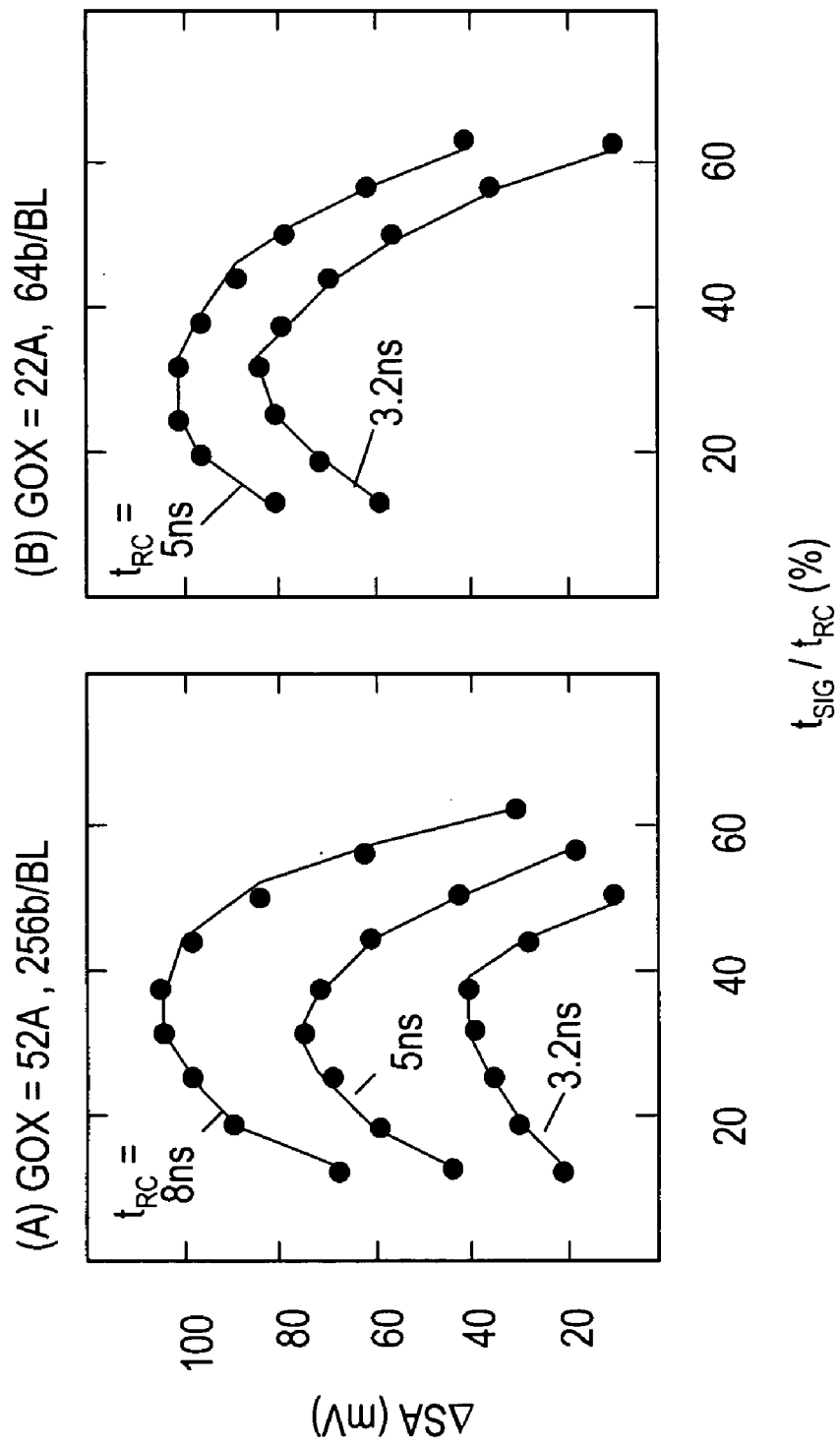
FIG. 1 shows two plots representing simulated sensing signals generated from two 256 b/BL and 64 b/BL DRAM arrays that illustrate the conventional shift from a data retention driven design to a memory availability driven design.
Figure 2:
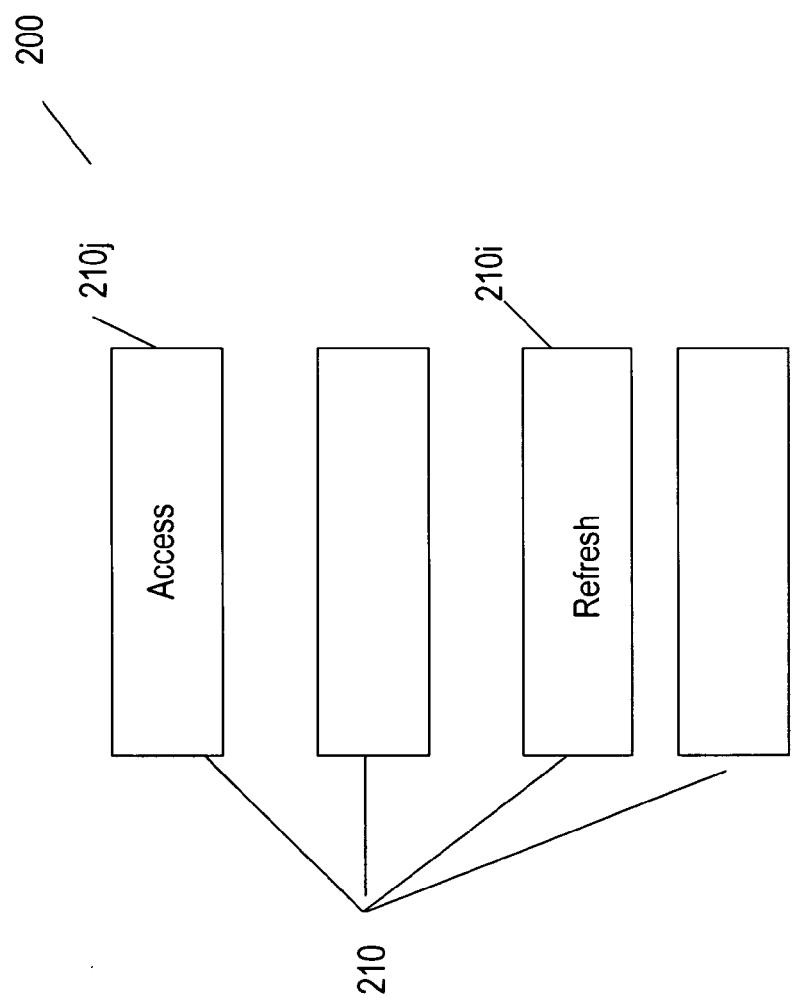
FIG. 2 shows a block diagram representing a multi-bank DRAM memory device to illustrate how the memory availability improves by applying a prior art concurrent performance of a refresh operation while enabling the memory access.
Figure 3:
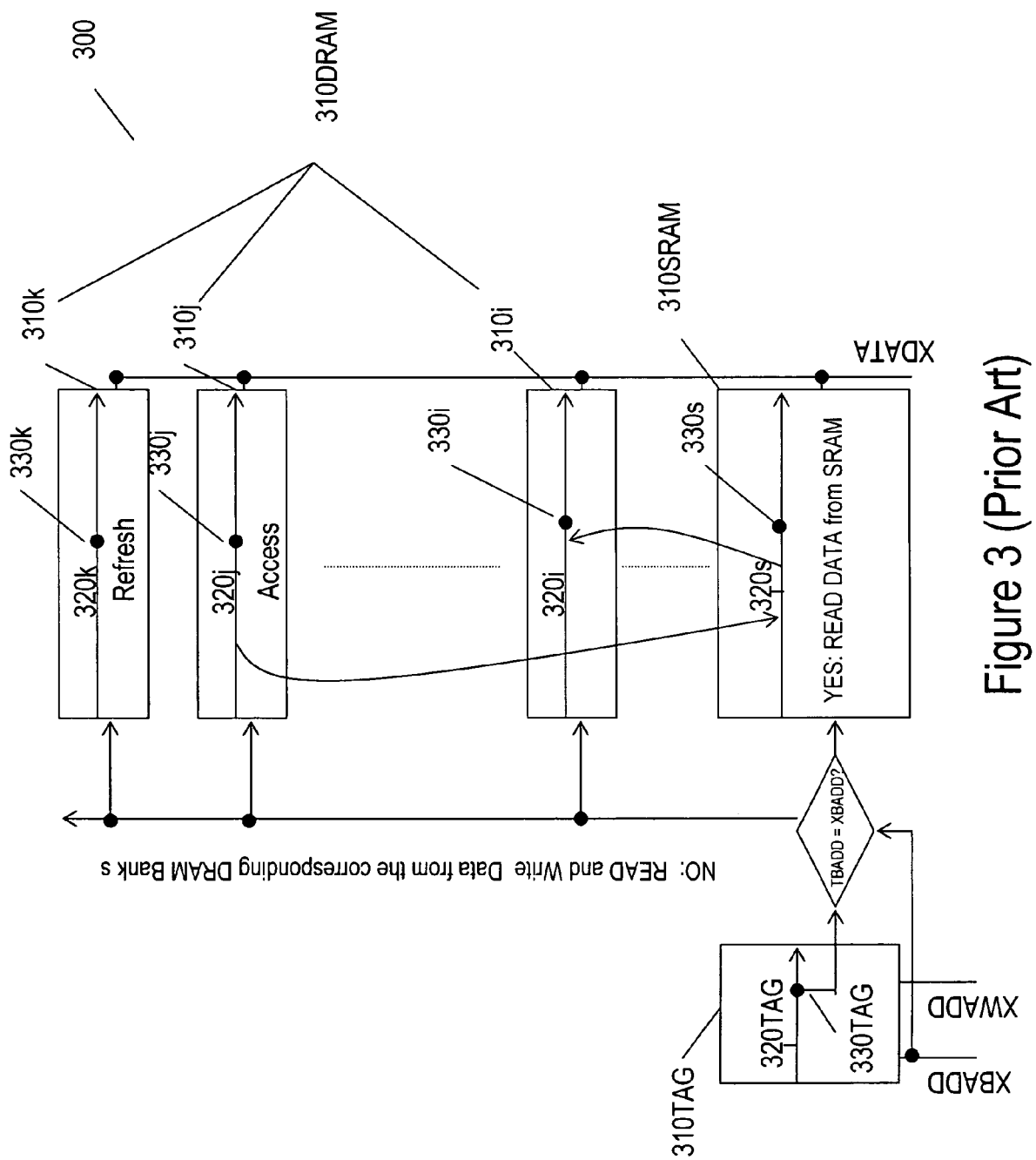
FIG. 3 illustrates a prior art method to enable a concurrent refresh mode in memory chip 300 which has been is enhanced by adding an SRAM, and which features a dual port function to receive and transfer data within one clock cycle.
Figure 4:
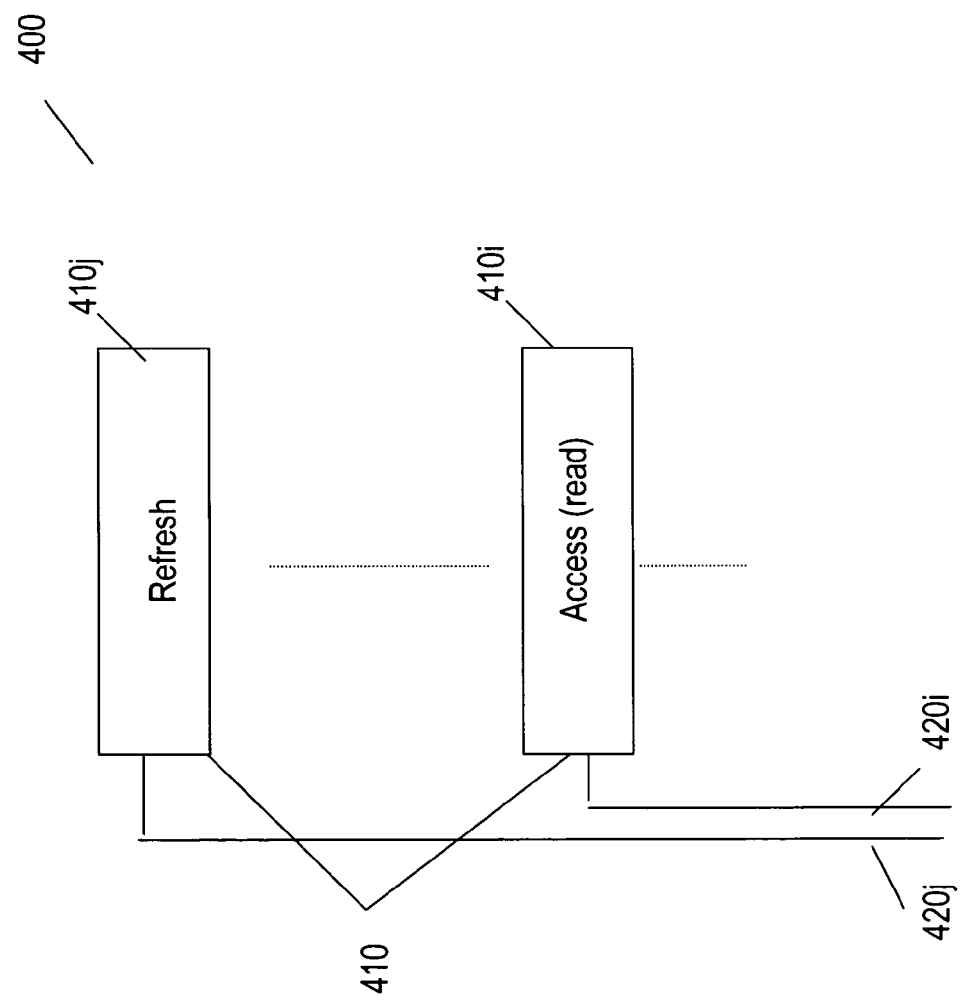
FIG. 4 is shows another conventional method that enables a concurrent refresh mode by utilizing a simultaneous function for a DRAM, wherein by way of the simultaneous function, the memory bank remains in the read mode while still enabling a refresh operation for the memory bank.
Figure 5:
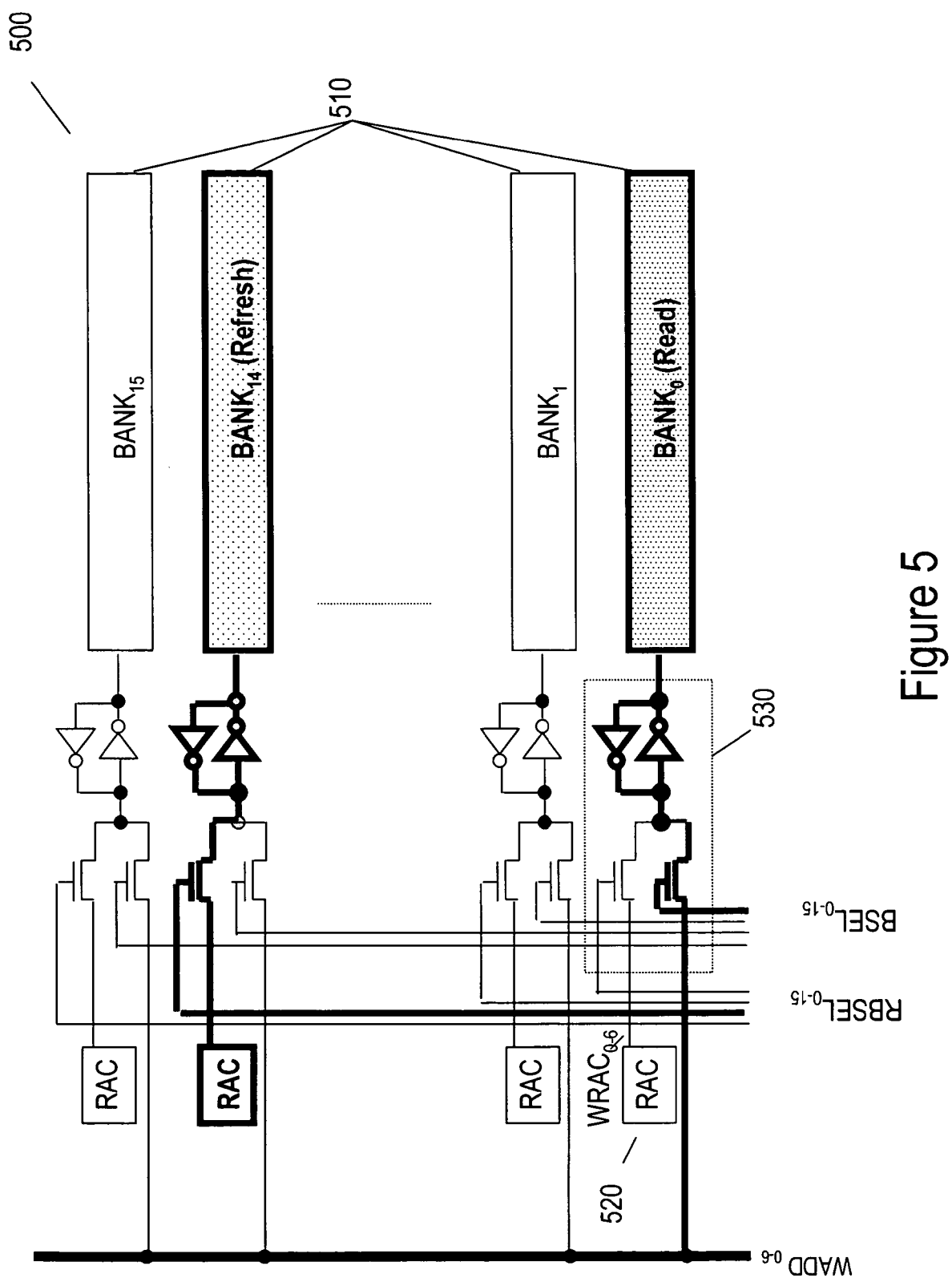
FIG. 5 illustrates a memory architecture applicable to a concurrent refresh mode with distributed row address counters, in accordance with the present invention.

Referring now to FIG. 5, there is shown a memory architecture provided with the inventive concurrent refresh mode with distributed row address counters. The present embodiment assumes an embedded DRAM macro. However the invention is also applicable to a stand-alone DRAM.

The DRAM macro employs a flexible multi-bank protocol having 16 independent bank select ports $BSEL_{0-15}$, each controlling a corresponding array of $BANK_{0-15}$. Optionally, $BSEL_{0-15}$ may be implemented as a four bit bank address vector that identifies one array of $BANK_{0-15}$. Unlike conventional DRAM macros, it further includes 16 refresh bank select ports $RBSEL_{0-15}$, each controlling the corresponding array as a bank independently from the memory access operation. The basic concept of the present invention is not a concurrent refresh mode, but the introduction of distributed row address counters integrated in each bank to achieve a greater simplification of the refresh management at the system level.

Each array includes a row address counter RAC (e.g., 520) that identifies the word address $WRAC_{0-6}$ for a concurrent refresh mode. Each array further includes a switch 530 to selectively couple either the word address $WADD_{0-6}$ or the word address $WRAC_{0-6}$ to the row decoder (not shown) of the array bank (BANK). For a memory access operation, the word address $WADD_{0-6}$ issued by bank select signal BSEL is coupled to the row decoder (not shown) in array 510 via switch 530. This allows the corresponding wordline (not shown) in the array 510 to be activated according to the word address $WADD_{0-6}$. On the other hand, when a bank refresh command RBSEL is issued, the word address ($WRAC_{0-6}$) from counter RAC 520 is coupled to the row decoder (not shown) in the array by way of switch 530. This allows the corresponding wordline (not shown) in the array 510 to be activated according to the word address ($WRAC_{0-6}$) in order to refresh the corresponding memory cells. By managing BSEL (i.e., $BSEL_0$), and RBESL (i.e., $RBSEL_0$), a memory access of an array (i.e., $BANK_0$) is enabled, while concurrently enabling a refresh operation for another array (i.e., $BANK_{14}$). Because the RAC counter is integrated in each bank, the wordline activation within the selected refresh bank (i.e. $BANK_0$) is internally managed. This greatly simplifies the system designs.

As previously mentioned, avoiding a bank contention is a well known design practice for a multi-bank memory system. Assuming that each array consists of 128 wordlines, data will be maintained as long as 128 refresh commands are issued for each bank within the retention time. This results in an almost total memory utilization by properly managing RBSEL. In a multi-bank system, the bank may be activated in a staggered manner for each bank-to-bank access time cycle (tRRD), while concurrently refreshing other arrays for each tRRD. Access contention between the accessed bank and the refreshed bank can be avoided as long as the activation of the same bank is longer than the random access cycle time (tRC). More particularly, activating a subsequent bank (BANKn) either by BSELn and RBSELn must be longer than tRC. This management is much simpler than the existing concurrent refresh management with corresponding address and command ports. No refresh address management for the selected refresh bank is necessary. Optionally, two or more memory arrays may be simultaneously refreshed while enabling the memory access for each clock cycle. This is advantageously realized by simultaneously activating a plurality of the refresh bank control signals $RBSEL_{0-15}$. The distributed RAC counter approach requires controlling RBSEL for the corresponding refreshed bank without establishing communication between the address port and the respective control circuitry. This results in a current saving as large as 10 mA assuming a seven address bus transition, each having a 1.5 pF capacitance operating at 1 GHz frequency. The current saving advantage is further improved as the memory speed and density increase.

Figure 6:
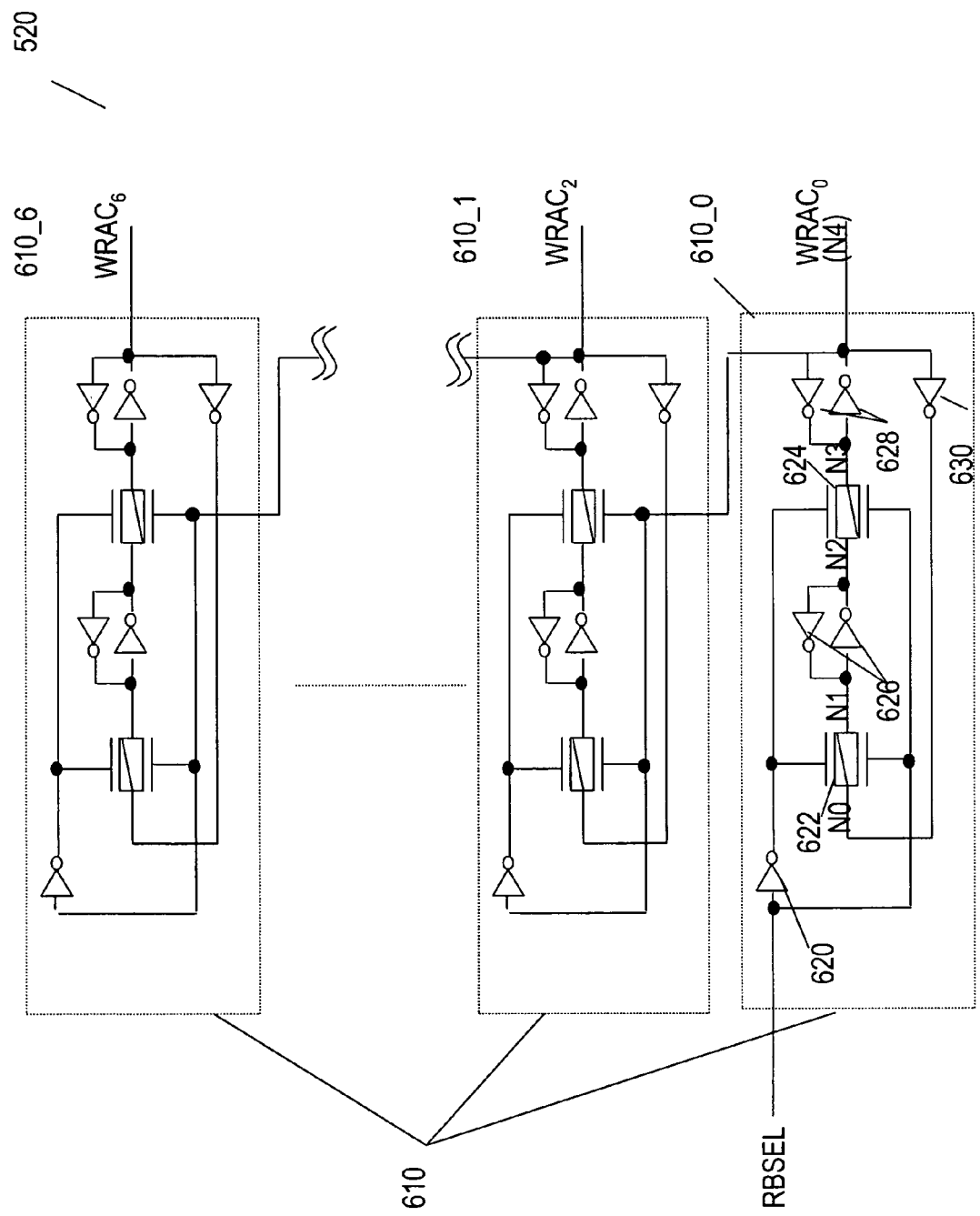
FIG. 6 shows a transistor level schematic of the row address counter integrated in each bank of the DRAM, according to present invention.

FIG. 6 is a transistor level schematic of the row address counter 520 integrated in each bank (BANK). The row address counter includes seven counter logic elements, 610_0 to 610_6, each generating a corresponding address bits $WRAC_{0-6}$. Each counter logic element (e.g., 610_0) consists of two CMOS pass gates 622 and 624, two CMOS latches 626 and 628, and two inverters 620 and 630. The refresh enable signal RBSEL shown in FIG. 5 is coupled to the NMOS gate for CMOS pass gate 622, and PMOS gate for CMOS pass gate 624. RBSEL is inverted by inverter 620 and coupled to the PMOS gate of CMOS pass gate 622 and NMOS gate of CMOS pass gate 624. Therefore, as long as signal RBSEL is at low, CMOS pass gate 624 couples node N2 to node N3, and subsequently to node N4. CMOS pass gate 622 remains off, isolating node N0 from N4. The output of $WRAC_0$ (coupling to N4) from the counter logic element 610_0 therefore follows node N1. When the signal RBSEL switches to high to enable a concurrent refresh mode, CMOS pass gates 622 and 624 switch on and off, respectively. $WRAC_0$ maintains the state at the original value set by CMOS latch 628. The state of node N1 is flipped by coupling node N0 to node N1, (Note: because node N0 is in the inverted state from $WRAC_0$). When RBSEL switches to low to disable the corresponding concurrent refresh mode, CMOS pass gates 622 and 624 turn off and on, respectively, allowing bit $WRAC_0$ to flip and follow node N1, which has been already updated. In conclusion, the bit $WRAC_0$ is flipped at each RBSEL cycle, and acts as the least significant address bit of the row address counter 520. For the remaining address bits ($WRAC_{1-6}$), CMOS pass gate 622 in element 610_n is coupled to the counter output N4 in the element 610_n−1, where n is an integer from 1 to 6. This allows bits $WRAC_1$ . . . , $WRAC_6$ to flip over, respectively, every 2, 4, 8, 16, 32, and 64 RBSEL cycles, creating a seven bit counter to generate a refresh address within each array.

Figure 7:
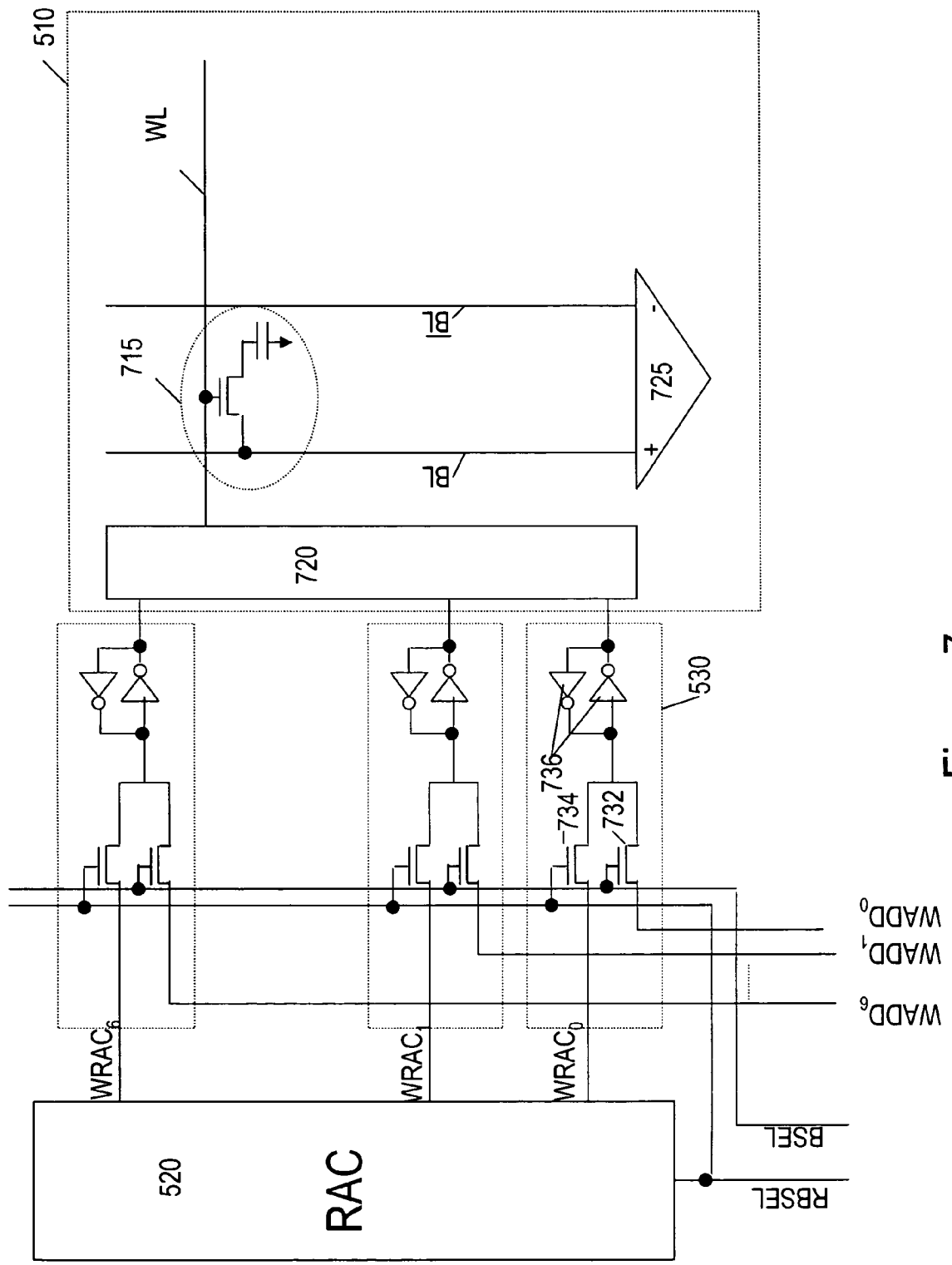
FIG. 7 shows a detailed bank architecture, consisting of a core, row address and switching elements, according to present invention.

FIG. 7 shows a more detailed bank architecture consisting of array 510, row address counter (RAC 520), and seven bit switching elements 530. The array includes a plurality of memory cells 715 arranged in a two-dimensional matrix as a cell array. The cell array is supported by row decoders 720 and bitline sense amplifiers 725. As previously discussed, the word address for a concurrent refresh mode and a memory access mode are supported by the word address $WRAC_0, \ldots, WRAC_6$ and the word address $WADD_0, \ldots,$ $WADD_6$, respectively. The selection is realized by the seven switching elements 530, each coupling either WADD or WRAC to the row decoder 720. For a memory access mode, the bank select signal BSEL switches to high, activating the NMOS 732 in each switching element 530. This couples the word address WADD to the CMOS latch 736. The WADD bit remains even after BSEL is switched to low by CMOS latch 736. For a concurrent refresh mode, the refresh bank select signal RBSEL switches to high, activating NMOS 734 in each switching element 730. This couples the word address WRAC to the CMOS latch 736. Latching the word address in switching element 530 allows the word address $WADD_0, \ldots, WADD_6$ to activate other banks during a multi-bank operation without waiting for the completion of the corresponding bank operation. Furthermore, during a multi-bank operation, a concurrent refresh operation may be issued for each bank activation cycle. By way of example, the first and second arrays are activated for refresh and memory access operations. Then, without waiting for the completion of the first and second memory array operation, the memory access operation for the third bank is enabled, while concurrently issuing the refresh operation for the forth array.

The wordline WL is activated by row decoder 720. The decoding bits are determined by the address bits transferred from the seven bit switching elements 530, as previously discussed. When the wordline switches to high, the data bits in the cells 715 are read and written through bitline BL. Differential BL pairs are advantageously coupled to bitline sense amplifiers 725, amplifying the small signal read from the cells 715. The sense amplifiers are used for writing back the data bits to the cells (715), which is well know and which, therefore, will not be discussed.

While the invention has been discussed in terms of several preferred embodiments, various alternative and modifications can be devised by those skilled in the art without departing from the invention. Accordingly, the present invention is intended to embrace all such alternatives which fall within the scope of the appended claims.

What is claimed is:

1. A semiconductor memory comprising:
    a plurality of memory arrays, each of which comprises a plurality of memory cells arranged in a matrix and controlled by a row address counter uniquely assigned to each of said memory arrays, said row address counter generating a first word address;
    means for enabling a refresh operation in said memory cells, said memory cells being identified by said first word address when a refresh command is issued to a corresponding memory array; and
    a memory access command provided by a bank select signal to a corresponding memory array, wherein each of said memory arrays further comprises a second word address common to at least two of said memory arrays, and wherein an enabling means enables a memory access operation in said memory cells, said memory cells being identified by said second word address when a memory access command is issued to a corresponding memory array, and wherein said refresh command is provided by a refresh bank select signal to a corresponding memory array.

2. The semiconductor memory as recited in claim 1, wherein said first word address is updated when said refresh operation has been completed, by incrementing said row address counter.

3. The semiconductor memory as recited in claim 1 wherein said refresh bank select signal enables a refresh operation in a first memory array while concurrently enabling a memory access operation in a second memory array.

4. The semiconductor memory as recited in claim 3, wherein said refresh bank select signal enables a refresh operation in at least one additional memory array while concurrently enabling a memory refresh operation in said first memory array and a memory access operation in said second memory array.

5. The semiconductor memory as recited in claim 3, wherein each of said plurality of the memory arrays further comprises switching means for selectively coupling said first and said second word address to row decoders within said memory array, and wherein a refresh operation is controlled by said first word address, and a memory access operation is controlled by the second word address.

6. The semiconductor memory as recited in claim 5, wherein each of said memory arrays further comprises word address latches, said word address latches being coupled to said switching means, and wherein a third memory array initiates a memory access operation when the corresponding bank select signal is provided to said third memory array without waiting for the completion of:
    a) said refresh operation in said first memory array, and
    b) said memory access operation in said second memory array.

7. The semiconductor memory as recited in claim 6, wherein a fourth memory array initiates a memory refresh operation when a corresponding refresh bank select signal is provided to said fourth memory array without waiting for the completion of:
    a) said refresh operation in said first memory array, and
    b) said memory access operation in said second memory array, while concurrently initiating a memory access operation in said third memory array.

8. The semiconductor memory as recited in claim 7, wherein said refresh bank select signal enables a refresh operation in at least one additional memory array while concurrently enabling a memory refresh operation in said first memory array and a memory access operation in said second memory array.

9. The semiconductor memory as recited in claim 8, wherein said refresh bank select signal enables a refresh operation in at least one additional memory array, while concurrently enabling a memory refresh operation in said fourth memory array and a memory access operation in said third memory array.

10. The semiconductor memory as recited in claim 1, wherein said refresh command and said memory access command are independent of each other.

11. The semiconductor memory as recited in claim 4, wherein said refresh bank select signal and a memory access command are distinct from each other.

12. The semiconductor memory as recited in claim 7, wherein the time interval for activating one of said memory arrays to perform either a refresh operation or a bank access operation is longer than a random access cycle time.

13. The semiconductor memory as recited in claim 12, wherein the time interval for activating at least two memory arrays to perform either a refresh operation or a bank access operation is shorter than the random access cycle time.

14. A semiconductor memory comprising:
    a plurality of memory arrays, each of said memory arrays comprising a plurality of memory cells arranged in a matrix and controlled by a row address counter uniquely assigned to each of said each memory arrays, said row address counter generating a first word address;

means enabling a refresh operation in said memory cells, wherein said memory cells are identified by the first word address when a refresh command is provided to a corresponding memory array;

a common second address coupling at least two memory arrays;

means for selectively coupling said first and said second word addresses to row decoders within each of said memory arrays, wherein a refresh operation is enabled by said first word address in a first memory array while enabling a memory access operation by said second word address in a second memory array, and wherein each of said at least two memory arrays further comprises word address latches coupled to switching means.

15. The semiconductor memory as recited in claim 14, wherein said first word address is updated when said refresh operation is completed by incrementing said row address counter.

16. A semiconductor memory comprising:

a plurality of memory arrays, each of which comprises a plurality of memory cells arranged in a matrix and controlled by a row address counter uniquely assigned to each of said memory arrays, said row address counter generating a first word address;

first and second bank select signals coupled to each of said memory arrays;

means for enabling a refresh operation for first memory cells in a first memory array of said memory arrays, said first memory cells being identified by said first word address when a refresh command is provided by said first bank select signal to said first memory array; and means for enabling a memory access operation for second memory cells in a second memory array of said memory arrays, said second memory cells being identified by a second word address when a memory access command is provided by said second bank select signal to said second memory array, wherein the memory refresh operation in said first memory array and the memory access operation in said second memory array are concurrently enabled, and wherein each of said memory arrays further comprises word address latches, said word address latches being coupled to switching means, and wherein a third memory array initiates a memory access operation when the corresponding bank select signal is provided to said third memory array without waiting for the completion of:

a) said refresh operation in said first memory array, and b) said memory access operation in said second memory array.

* * * * *